US008114578B2

(12) United States Patent
Lee et al.

(10) Patent No.: US 8,114,578 B2
(45) Date of Patent: Feb. 14, 2012

(54) METHOD OF MANUFACTURING PHOTOSENSITIVE EPOXY STRUCTURE USING PHOTOLITHOGRAPHY PROCESS AND METHOD OF MANUFACTURING INKJET PRINTHEAD USING THE METHOD OF MANUFACTURING PHOTOSENSITIVE EPOXY STRUCTURE

(75) Inventors: Moon-chul Lee, Yongin-si (KR); Yong-seop Yoon, Seoul (KR); Min-soo Kim, Seoul (KR); Yong-won Jeong, Seoul (KR); Dong-sik Shim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1078 days.

(21) Appl. No.: 11/968,809

(22) Filed: Jan. 3, 2008

(65) Prior Publication Data

US 2009/0047605 A1 Feb. 19, 2009

(30) Foreign Application Priority Data

Aug. 13, 2007 (KR) .................. 10-2007-0081461

(51) Int. Cl.
*B41J 2/16* (2006.01)
(52) U.S. Cl. ........................................ 430/320; 430/394
(58) Field of Classification Search ........................ None
See application file for complete search history.

(56) References Cited

U.S. PATENT DOCUMENTS

2003/0048328 A1* 3/2003 Inamoto et al. ................. 347/44
2003/0087199 A1* 5/2003 Kim et al. ..................... 430/320

FOREIGN PATENT DOCUMENTS

JP 2004-017344 A * 1/2004

OTHER PUBLICATIONS

Computer-generated translation of JP 2004-017344 (Jan. 2004).*

* cited by examiner

Primary Examiner — John A. McPherson
(74) Attorney, Agent, or Firm — Stanzione & Kim, LLP

(57) ABSTRACT

Provided are a method of manufacturing a photosensitive epoxy structure using a photolithograph process, and a method of manufacturing an inkjet printhead using the method of manufacturing a photosensitive epoxy structure. The method of manufacturing the photosensitive epoxy structure includes forming an epoxy material layer formed of photosensitive epoxy; forming a first exposure pattern in the epoxy material layer by performing a first exposure operation; forming a second exposure pattern in the non-exposed portions of the epoxy material layer by performing a second exposure operation; and developing the epoxy material layer, wherein the amount of first UV energy used in the first exposure operation is different from the amount of second UV energy used in the second exposure operation.

16 Claims, 12 Drawing Sheets

ID OF MANUFACTURING
PHOTOSENSITIVE EPOXY STRUCTURE
USING PHOTOLITHOGRAPHY PROCESS
AND METHOD OF MANUFACTURING
INKJET PRINTHEAD USING THE METHOD
OF MANUFACTURING PHOTOSENSITIVE
EPOXY STRUCTURE

CROSS-REFERENCE TO RELATED
APPLICATIONS

This application claims the benefit of Korean Patent Application No. 10-2007-0081461, filed on Aug. 13, 2007, in the Korean Intellectual Property Office, the disclosure of which is incorporated herein in its entirety by reference.

BACKGROUND OF THE INVENTION

1. Field of the Invention

The present invention relates to a method of manufacturing a photosensitive epoxy structure, and more particularly, to a method of manufacturing a photosensitive epoxy structure with a step difference and a through hole by using a photography process and a method of manufacturing an inkjet printhead by using the method of manufacturing a photosensitive epoxy structure.

2. Description of the Related Art

Generally, an inkjet printhead is an apparatus that ejects fine droplets of a printing ink on a desired area of a recording paper in order to print predetermined color images. The inkjet printhead can be classified into two types according to the ejection mechanism of ink droplets. One type is a thermal inkjet printhead that ejects ink droplets by an expansion force of bubbles that are generated from ink by a thermal source, and the other type is a piezoelectric inkjet printhead that ejects ink droplets by applying a pressure generated by deformation of a piezoelectric element to the ink.

The ejection mechanism of ink droplets from a thermal inkjet printhead will now be described in more detail. When a pulse current is applied to a heater formed of a resistive heating material, the heater generates heat, and thus, ink adjacent to the heater is immediately heated to about 300□, thereby generating bubbles due to the boiling of the ink. The bubbles expand and pressurize ink filled in an ink chamber. As a result, ink positioned near a nozzle is ejected in the form of droplets from the ink chamber through the nozzle.

FIG. 1 is a partial plan view illustrating a conventional thermal inkjet printhead, and FIG. 2 is a sectional view taken along line II-II' of FIG. 1. Referring to FIGS. 1 and 2, the conventional thermal inkjet printhead includes a substrate 10 on which a plurality of material layers are disposed, a chamber layer 20 disposed on the substrate 10, and a nozzle layer 30 disposed on the chamber layer 20. A plurality of ink chambers 22 are formed in the chamber layer 20, and a plurality of nozzles 32 through which ink is ejected are formed in the nozzle layer 30. An ink feed hole 11, for supplying ink to the ink chambers 22, is formed through the substrate 10. A plurality of restrictors 24 are formed in the chamber layer 20 to connect the ink chambers 22 with the ink feed hole 11.

Meanwhile, an insulating layer 12, for insulating the substrate 10 from a plurality of heaters 14, is formed on the substrate 10. The heaters 14 are formed on the insulating layer 12, and electrodes 16, for applying a current to the heaters 14, are formed on the heaters 14. A passivation layer 18 is formed on the insulating layer 12, covering the heaters 14 and the electrodes 16. Anti-cavitation layers 19 are formed on the passivation layer 18 to protect the heaters 14 from a cavitation force generated by the collapse of the bubbles.

In the inkjet printhead having the above structure, the chamber layer 20 may be formed using a method in which photosensitive epoxy is coated on the substrate 10 and the coated photosensitive epoxy is patterned, and then a top surface of the chamber layer 20 may be planarized using chemical mechanical polishing (CMP). The nozzle layer 30 may be formed using a method in which photosensitive epoxy is coated on the chamber layer 20, and then the coated photosensitive epoxy is patterned. However, it is difficult to accurately form the chamber layer 20 to a desired thickness by using conventional CMP. Since the ejection characteristic of ink droplets that are to be ejected due to ink left positioned near the nozzles 32, which is left after ink has been ejected, can be poor, it is required to manufacture a nozzle layer having an improved structure so as to improve the ejection characteristic of ink droplets.

Meanwhile, when photosensitive epoxy, which is a material constituting the chamber layer 20 and the nozzle layer 30, is patterned using a conventional photography process, it is impossible to manufacture a structure including step differences having different heights or a structure including a through hole together with a step difference.

SUMMARY OF THE INVENTION

To solve the above and/or other problems, the present invention provides a method of manufacturing a photosensitive epoxy structure including a step difference by using a photolithography process, and a method of manufacturing a chamber layer and a nozzle layer of an inkjet printhead Additional aspects and utilities of the present general inventive concept will be set forth in part in the description which follows and, in part, will be obvious from the description, or may be learned by practice of the general inventive concept.

According to an aspect of the present invention, there is provided a method of manufacturing a photosensitive epoxy structure, the method including: forming an epoxy material layer formed of photosensitive epoxy; forming a first exposure pattern in the epoxy material layer by performing a first exposure operation; forming a second exposure pattern in the non-exposed portion of the epoxy material layer by performing a second exposure operation; and developing the epoxy material layer, wherein the amount of first UV energy used in the first exposure operation is different from the amount of second UV energy used in the second exposure operation.

The photosensitive epoxy may be a negative photoresist.

The amount of the second UV energy may be less than the amount of the first UV energy. The first exposure pattern may be not developed in the developing operation, only a part of the second exposure pattern is developed to form a groove to a predetermined depth. A non-exposed portion of the epoxy material layer may be entirely removed in the developing operation to form a through hole.

The first UV energy and the second UV energy may be controlled according to an exposure time.

The method may further include: forming a third exposure pattern in non-exposed portions of the epoxy material layer by performing a third exposure operation, after forming the second exposure pattern.

The amount of third UV energy used in the third exposure operation may be different from the amount of each of the first UV energy and the second UV energy.

The at least one groove circularly may surround the nozzle.

According to another aspect of the present invention, there is provided a method of manufacturing an inkjet printhead, the method including: forming a chamber material layer formed of photosensitive epoxy on a substrate on which a heater and an electrode are formed; forming a first exposure pattern in the chamber material layer by performing a first exposure operation; forming a second exposure pattern surrounding a non-exposed portion of the chamber material layer by performing a second exposure operation in which UV energy having an amount less than the amount of UV energy used in the first exposure operation; and forming a chamber layer, in which an ink chamber and at least one groove are formed, by developing the chamber material layer.

The method may further include: forming a sacrificial layer on the chamber layer to fill into the ink chamber and the at least one groove; and planarizing top surfaces of the sacrificial layer and the chamber layer by using chemical mechanical polishing (CMP), after forming of the chamber layer. The chemical mechanical polishing (CMP) may be terminated at a point when the sacrificial layer filled in the at least one groove is removed.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
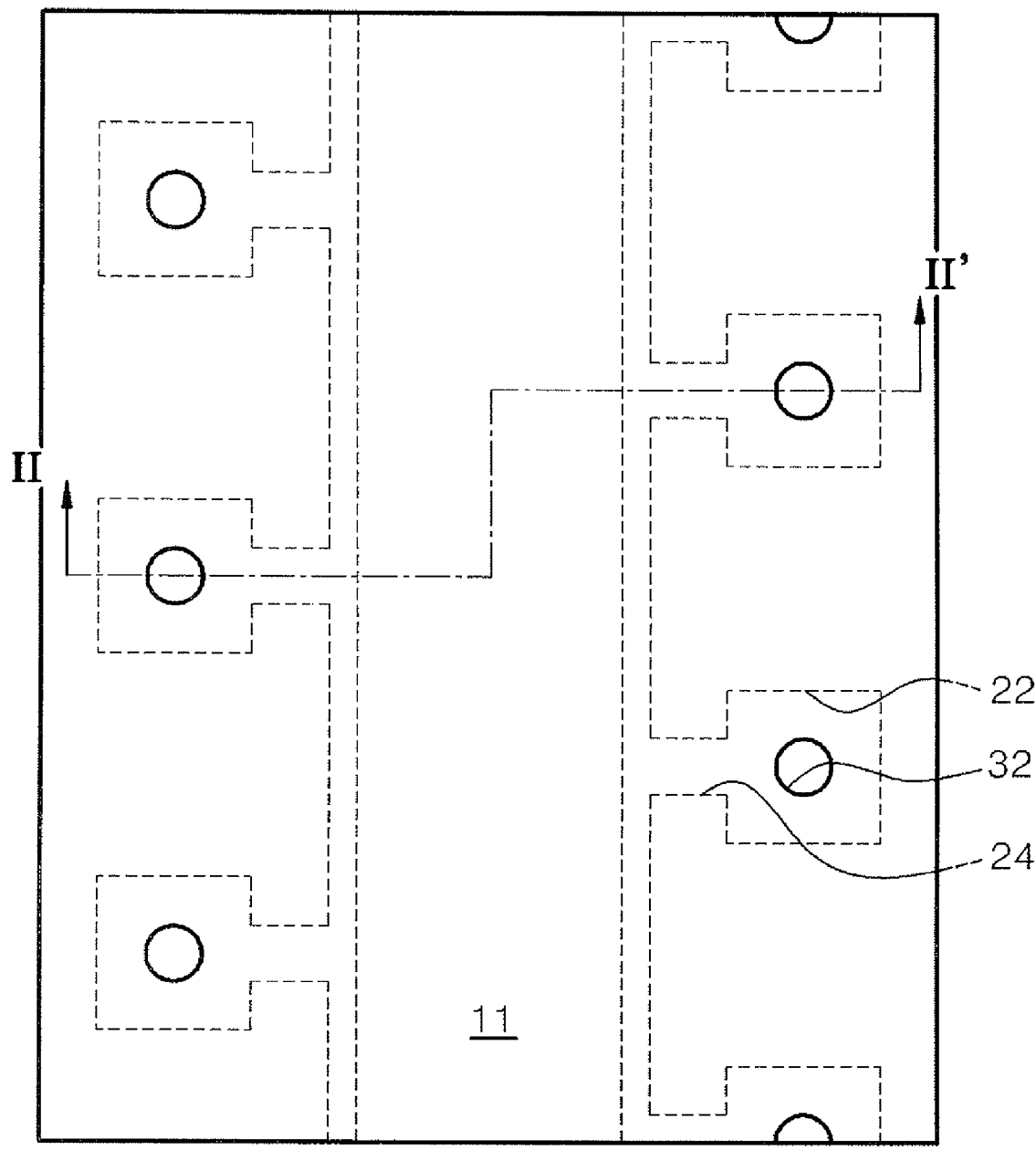
FIG. 1 is a partial plan view illustrating a conventional thermal inkjet printhead.
Figure 2:
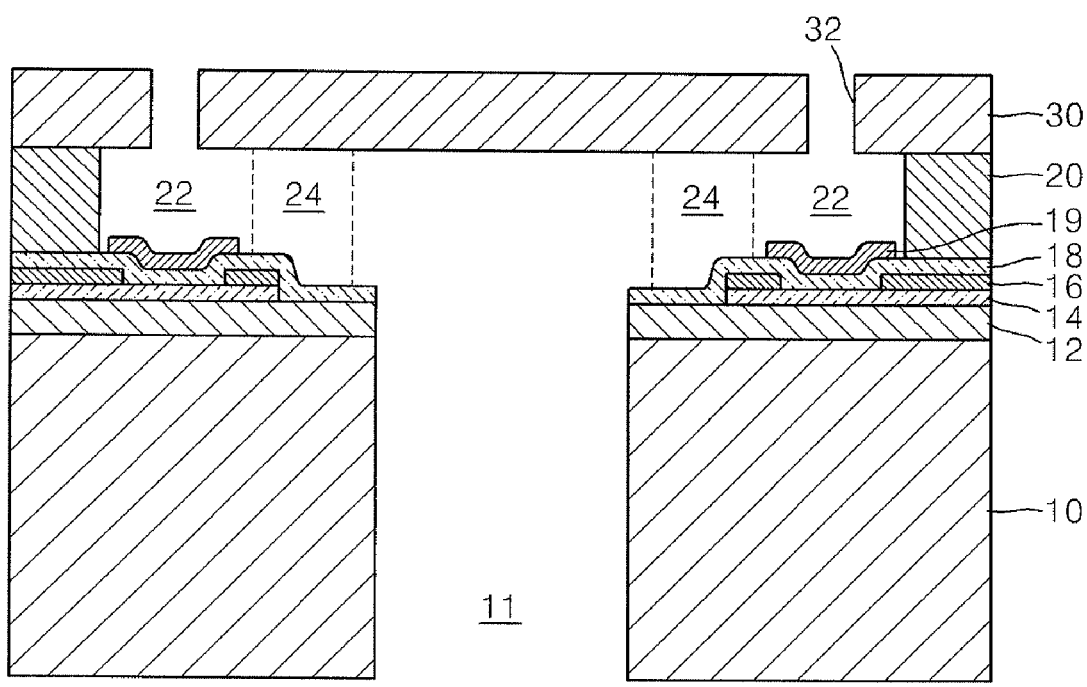
FIG. 2 is a sectional view taken along line II-II' of FIG. 1.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIGS. 3 through 7 are views illustrating a method of manufacturing a photosensitive epoxy structure, according to an embodiment of the present invention.

Figure 3:
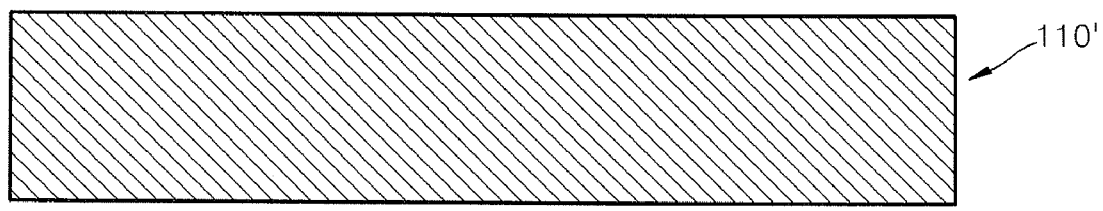
FIGS. 3 through 7 are views illustrating a method of manufacturing a photosensitive epoxy structure, according to an embodiment of the present invention.
Figure 4:
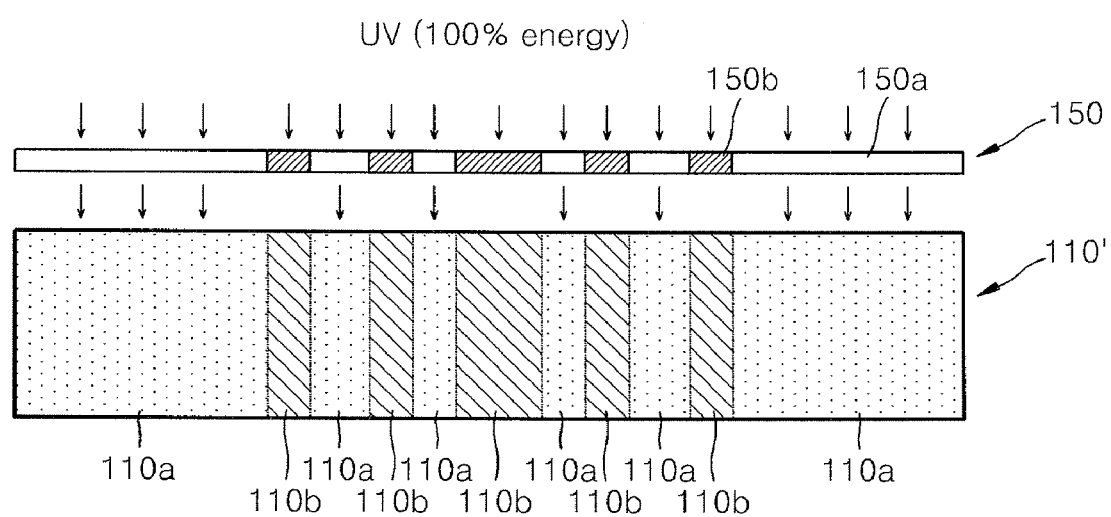

Referring to FIG. 3, an epoxy material layer 110' formed of photosensitive epoxy is prepared. The epoxy material layer 110' may be formed by coating photosensitive epoxy on a predetermined substrate (not shown) by using, for example, spin-coating. The photosensitive epoxy may be a negative photoresist. Referring to FIG. 4, first exposure patterns 110a are formed by performing a first exposure operation on the epoxy material layer 110'. In particular, a first photomask 150, in which light shielding patterns 150b and light transmitting patterns 150a are formed, is positioned above the epoxy material layer 110', and the epoxy material layer 110' is exposed to ultraviolet (UV) for a predetermined time. The light shielding patterns 150b may be formed of, for example, Cr, and the light transmitting patterns 150a may be formed of, for example, transparent glass. In the first exposure operation, the first exposure patterns 110a are formed by exposing the epoxy material layer 110' positioned below the light transmitting patterns 150a to UV rays. UV energy used for forming the first exposure patterns 110a is referred to as first UV energy. For example, the first UV energy used for forming the first exposure patterns 110a is at 100% exposure. The fact that the first exposure patterns 110a are formed at 100% exposure means that the first exposure patterns 110a are never developed even though a non-exposed portion 110b is entirely removed using a developing operation as will be later described.

Figure 5:
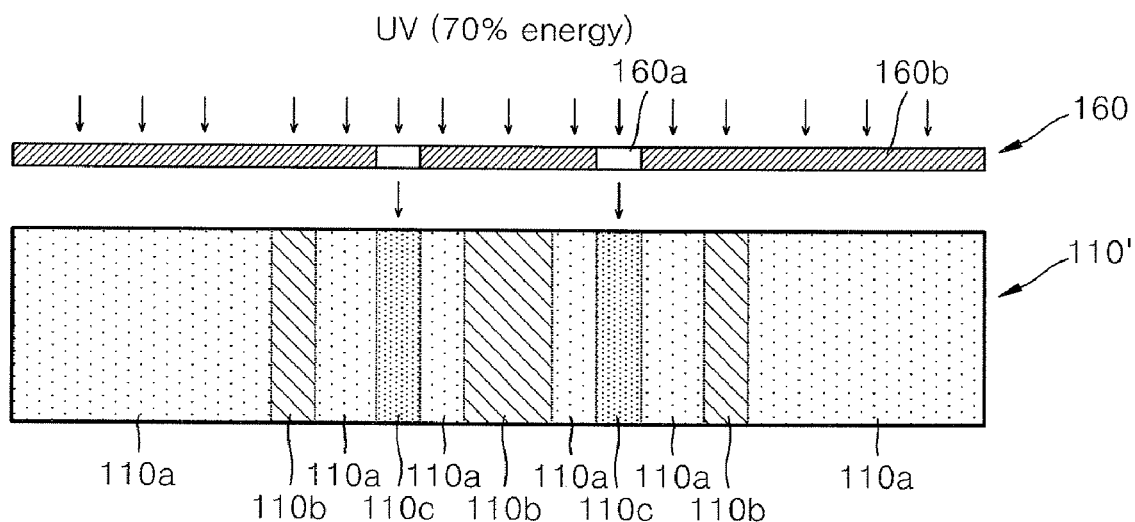

Then, referring to FIG. 5, a second exposure operation is performed on to the epoxy material layer 110', to which the first exposure operation has been performed, to form second exposure patterns 110c. In particular, a second photomask 160, in which light shielding patterns 160b and light transmitting patterns 160a are formed, is positioned above the epoxy material layer 110', and then the epoxy material layer 110' is exposed to ultraviolet (UV) rays for a predetermined time. In the second exposure operation, the non-exposed portions 110b of the epoxy material layer 110', which are positioned below the light transmitting patterns 160a, are exposed to UV rays to form the second exposure patterns 110c. UV energy used for forming the second exposure patterns 110c is referred to as second UV energy, the amount of which is different from that of the first UV energy. For example, the second UV energy may be about 70% of the first UV energy. The second exposure patterns 110c may be formed by exposing the non-exposed portions 110b to the second UV energy, which is 70% of the first UV energy. The first UV energy and the second UV energy can be controlled according to an exposure time. For example, when the first UV energy is obtained by exposing the epoxy material layer 110' to UV rays for ten seconds, the second UV energy can be obtained by exposing the epoxy material layer 110' to UV rays for seven seconds.

Figure 6:
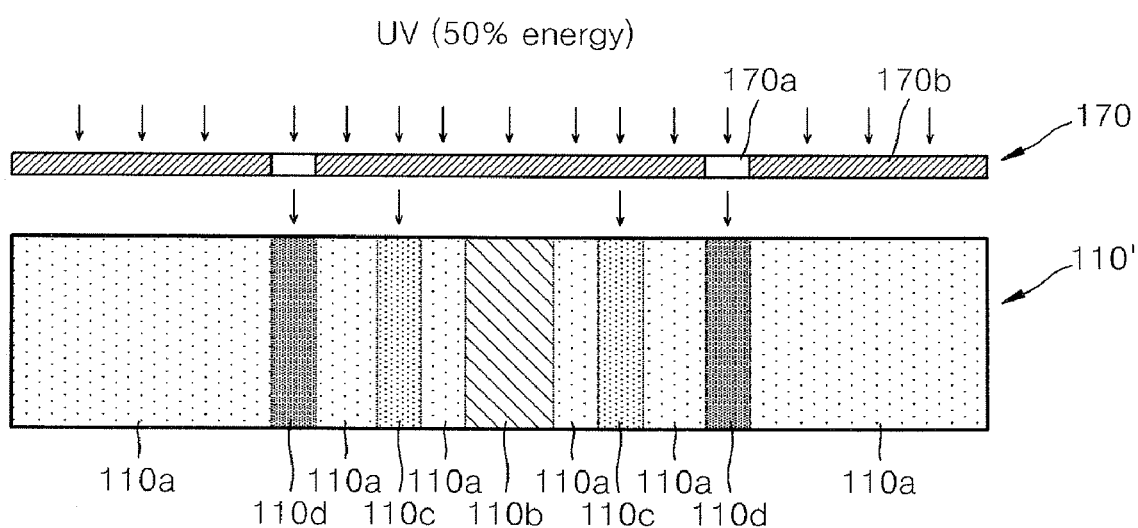

Referring to FIG. 6, a third exposure operation is further performed on the epoxy material layer 110', to which the second exposure operation has been performed, to form third exposure patterns 110d. In particular, a third photomask 170, in which light shielding patterns 170b and light transmitting patterns 170a are formed, is positioned above the epoxy material layer 110', and then the epoxy material layer 110' is exposed to ultraviolet (UV) rays for a predetermined time. In the third exposure operation, the non-exposed portions 110b of the epoxy material layer 110', which are positioned below the light transmitting patterns 170a, are exposed to UV rays to form the third exposure patterns 110d. UV energy used for forming the third exposure patterns 110d is referred to as third UV energy, the amount of which is different from that of each of the first UV energy and the second UV energy. For example, the third UV energy may be 50% of the first UV energy. The third exposure patterns 110d may be formed by exposing the non-exposed portions 110b, which are positioned below the light transmitting patterns 170a, to the third UV energy, which is 50% of the first UV energy. The third UV energy can be controlled according to an exposure time. For example, when the first UV energy is obtained by exposing the epoxy material layer 110' to UV rays for ten seconds, the third UV energy can be obtained by exposing the epoxy material layer 110' to UV rays for five seconds.

Figure 7:
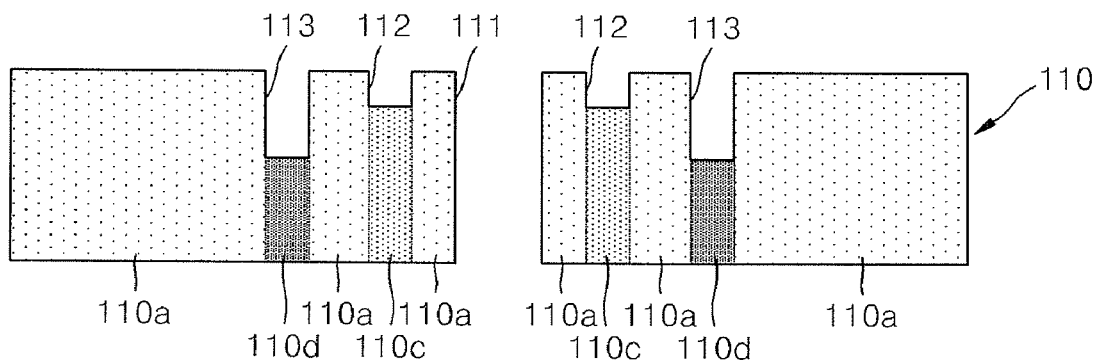

Referring to FIG. 7, a developing operation is performed on the epoxy material layer 110', to which the first through third exposure operations have been performed, to thereby complete the epoxy material layer 110'. In the developing operation, the non-exposed portion 110b of the epoxy material layer 110' is entirely removed by a developer to form a through hole 111. The first exposure patterns 110a are not developed so as to remain in the epoxy material layer 110'. Since the second exposure patterns 110c are exposed at 70% of the first UV energy, only a part of the second exposure patterns 110c reacts with a developer to remove the part of the second exposure patterns 110c. Accordingly, a first groove 112 may be formed to a predetermined depth in the second exposure patterns 110c. Since the third exposure patterns 110d are exposed at 50% of the first UV energy, a second groove 113 may be formed to a predetermined depth, which is greater than the depth of the first groove 112, in the third exposure patterns 110d by performing a developing operation.

As described above, according to the current embodiment of the present invention, a plurality of exposure operations, in which UV energies having different amounts from one another are respectively used, are performed on the epoxy material layer 110' formed of photosensitive epoxy, and then the epoxy material layer 110' is developed. Thus, a photosensitive epoxy structure that has step differences, the heights of which are different from one another, or a photosensitive epoxy structure having a through hole and a step difference can be manufactured. As illustrated in FIGS. 3 through 7, three exposure operations are performed; however, the present invention is not limited thereto. That is, it is understood by one of ordinary skill in the art that two exposure operations, or four or more exposure operations can be performed. In addition, a ratio of the second UV energy or the third UV energy with respect to the first UV energy may be variously changed.

Hereinafter, a method of manufacturing an inkjet printhead, using the method of manufacturing the photosensitive epoxy structure illustrated in FIGS. 3 through 7 will be described.

FIGS. 8 through 12 are views illustrating the method of manufacturing an inkjet printhead (i.e., a nozzle layer), according to an embodiment of the present invention.

Figure 8:
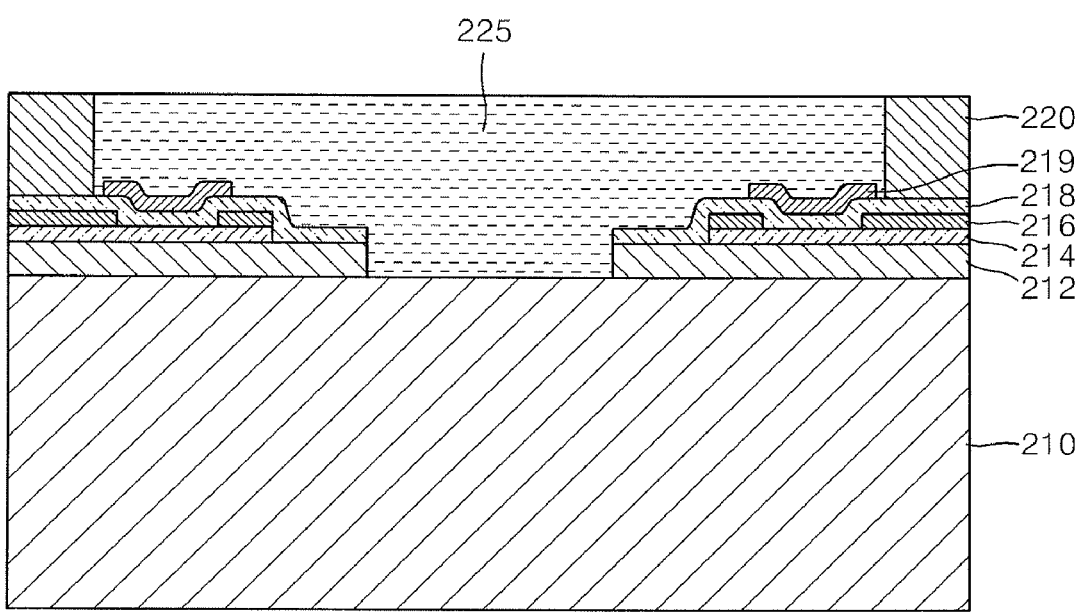
FIGS. 8 through 12 are views illustrating a method of manufacturing an inkjet printhead, according to an embodiment of the present invention.

Referring to FIG. 8, a chamber layer 220, in which an ink chamber (not shown) is formed, is formed on a substrate 210 on which heaters 214 and electrodes 216 are formed, and a sacrificial layer 225 is formed on the substrate 210 to fill into the ink chamber, as will be described in more detail. First, insulating layers 212, the heaters 214, the electrodes 216 and passivation layers 218 are sequentially formed on the substrate 210, which may be a silicon substrate. The insulating layers 212 insulate the heaters 214 from the substrate 210, and may be formed of, for example, silicon oxide. The heaters 214 heat ink to generate bubbles, and may be formed using a method in which a heating resistor (e.g., a tantalum-aluminum alloy, tantalum-nitride, titanium nitride, tungsten silicide or the like) is deposited on the insulating layer 212, and then the heating resistor is patterned. The electrodes 216 apply a current to the heaters 214, and may be formed using a method in which metal having high electroconductivity (e.g., aluminum, an aluminum alloy, gold, silver or the like) is deposited on the heaters 214 and then the material is patterned. A passivation layer 218 is formed on the insulating layers 212 so as to cover the heaters 214 and the electrodes 216. The passivation layer 218 prevents the heaters 214 and the electrodes 216 from contacting ink that can oxidize or corrode the heaters 214 and the electrodes 216, and may be formed of, for example, silicon oxide or silicon nitride. An anti-cavitation layer may be further formed on the passivation layer 218 to protect the heaters 214 from a cavitation force that is generated when bubbles collapse and collapse, and may be formed of, for example, tantalum (Ta). Then, the chamber layer 220, in which the ink chamber is formed, is formed on the substrate 210 on which a plurality of material layers are formed. The chamber layer 220 is formed using a method in which photosensitive epoxy is formed to a predetermined thickness on the substrate 210, and then the photosensitive epoxy is patterned. The sacrificial layer 225 is formed on the chamber layer 220 to fill into the ink chamber. Planarization may be further performed on the sacrificial layer 225 and the chamber layer 220 by using chemical mechanical polishing (CMP).

Figure 9:
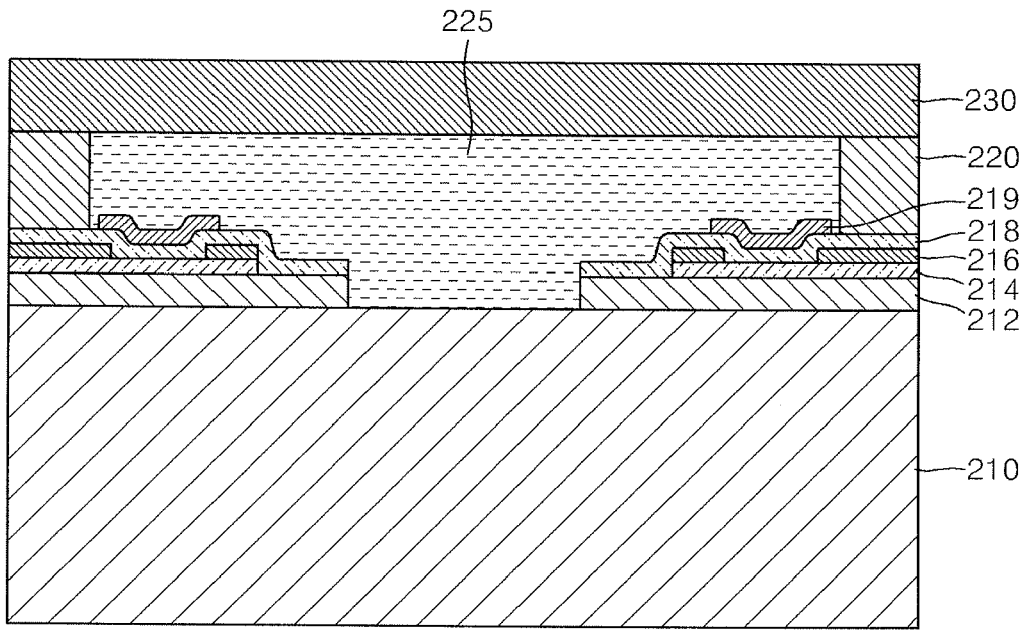
Figure 10:
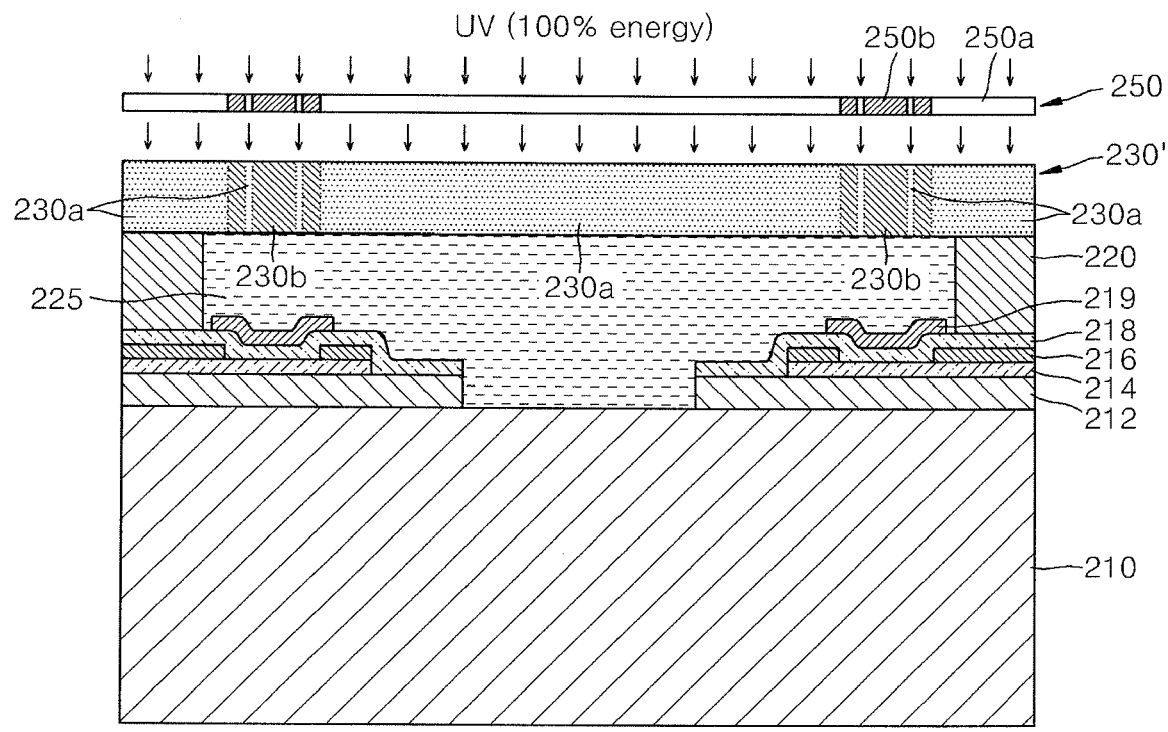

Referring to FIG. 9, a nozzle material layer 230', formed of photosensitive epoxy, is formed on the chamber layer 220 and the sacrificial layer 225, wherein the photosensitive epoxy may be a negative photoresist. Referring to FIG. 10, a first exposure operation is performed on the nozzle material layer 230' to form first exposure patterns 230a. In particular, a first photomask 250, in which light shielding patterns 250b and light transmitting patterns 250a are formed, is positioned above the nozzle material layer 230', and then the nozzle material layer 230' is exposed to ultraviolet (UV) rays for a predetermined time. The light shielding patterns 250b may be formed of, for example, Cr, and the nozzle material layer 230' positioned below the light transmitting patterns 250a may be formed of, for example, transparent glass. In the first exposure operation, the first exposure patterns 230a of the nozzle material layer 230' are formed by exposing the light transmitting patterns 250a of the first photomask 250 to UV rays. UV energy used for forming the first exposure patterns 230a is referred to as first UV energy for which the first exposure patterns 230a are at 100% exposure. The fact that the first exposure patterns 230a are exposed at 100% exposure means that the first exposure patterns 230a are never developed even though a non-exposed portion 230b is entirely removed using a developing operation as will be later described.

Figure 11:
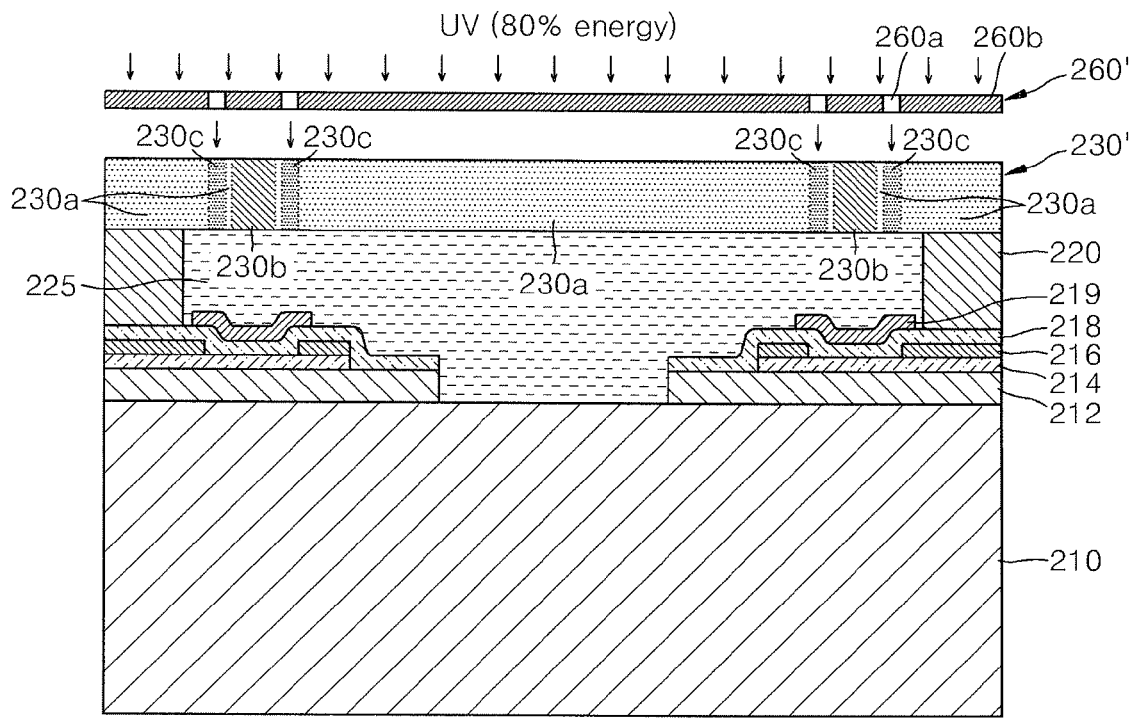

Referring to FIG. 11, a second exposure operation is performed on the nozzle material layer 230', to which the first exposure operation has been performed, to form second exposure patterns 230c. In particular, a second photomask 260, in which light shielding patterns 260b and light transmitting patterns 260a are formed, is positioned above the nozzle material layer 230', and then the nozzle material layer 230' is exposed to ultraviolet (UV) rays for a predetermined time. In the second exposure operation, the non-exposed portions 230b of the nozzle material layer 230', which are positioned below the light transmitting patterns 260a of the second photomask, are exposed to UV rays to form the second exposure patterns 230c. The second exposure patterns 230c may surround the non-exposed portion 230b. The UV energy used for forming the second exposure patterns 230c is referred to as second UV energy, the amount of which is less than that of the first UV energy. For example, the second UV energy may be 80% of the first UV energy. The second exposure patterns 230c may be formed by exposing the non-exposed portions 230b to 80% of the first UV energy. The first UV energy and the second UV energy can be controlled according to an exposure time. For example, when the first UV energy is obtained by exposing the nozzle material layer 230' to UV rays for 10 seconds, the second UV energy can be obtained by exposing the nozzle material layer 230' to UV rays for eight seconds.

Figure 12:
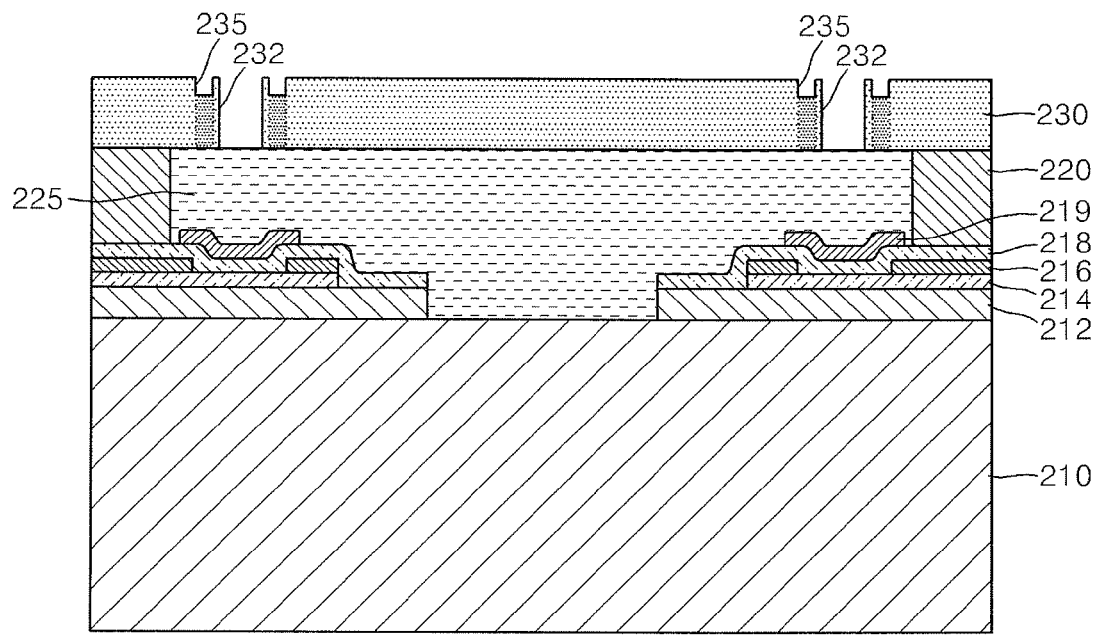
Figure 13:
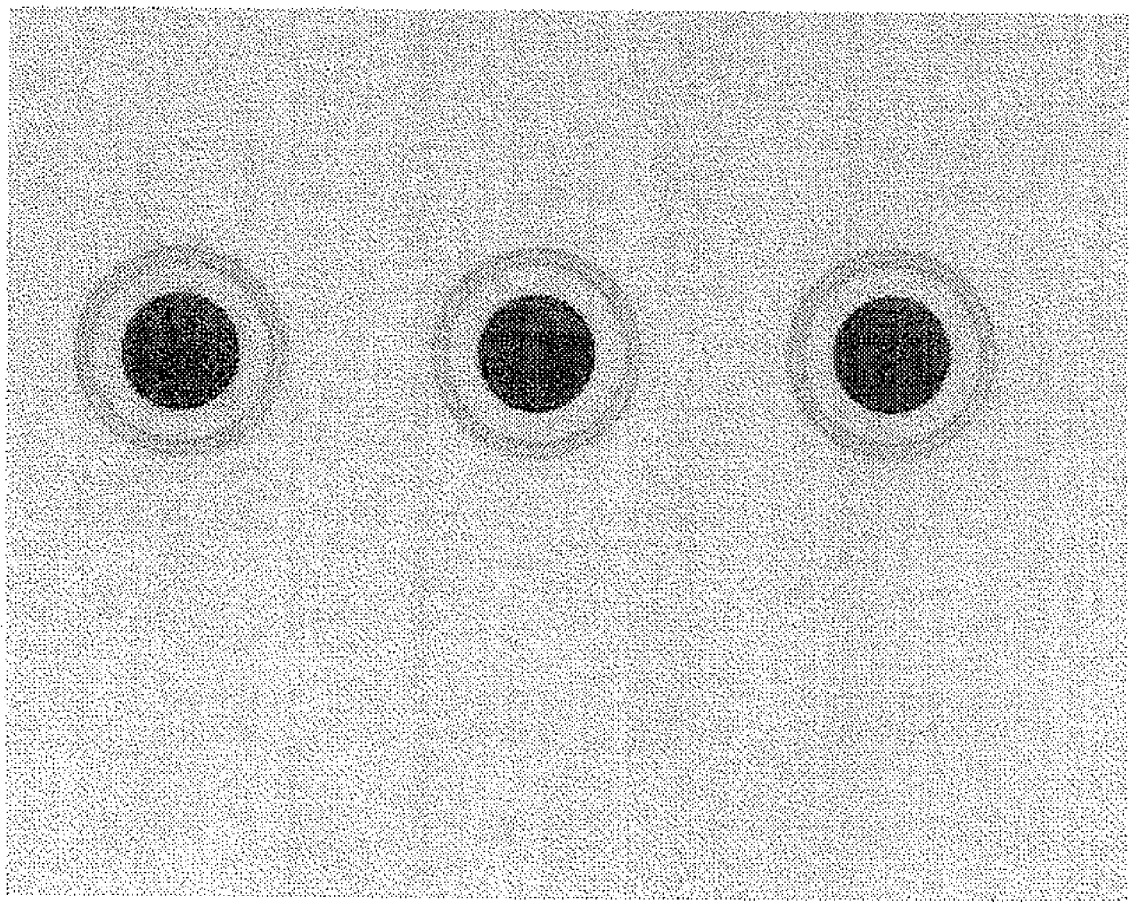
FIG. 13 is an image of a plan view of a nozzle layer manufactured using the method illustrated in FIGS. 8 through 12.

Referring to FIG. 12, a developing operation is performed on the nozzle material layer 230', to which the first and second exposure operations have been performed, to form a nozzle layer 230. In the developing operation, the non-exposed portion 230b of the nozzle material layer 230' is entirely removed by a developer to form nozzles 232. Accordingly, the nozzles 232 are formed corresponding to the shape of the non-exposed portion 230b. The first exposure patterns 230a are not developed so as to remain in the epoxy material layer. Since the second exposure patterns 230c are exposed to 80% of the first UV energy, only a part of the second exposure patterns 230c reacts with a developer to remove the part of the second exposure patterns 230c. Accordingly, circular grooves 235, each of which surrounds each of the nozzles 232 and has a predetermined depth. FIG. 13 is an image of a plan view of a nozzle layer manufactured using the method illustrated in FIGS. 8 through 12. In FIG. 13, one of the circular grooves 235 is illustrated surrounding one of the nozzles 232, however, the present invention is not limited thereto, and thus, it will be understood by one of ordinary skill in the art that a plurality of circular grooves 235 may surround one of the nozzles 232.

Likewise, since ink left after ejecting the ink is filled into the grooves 235, the ejection characteristic of ink droplets to be later ejected can be improved.

FIGS. 14 through 21 are views illustrating a method of manufacturing an inkjet printhead (i.e., a nozzle layer), according to another embodiment of the present invention.

Figure 14:
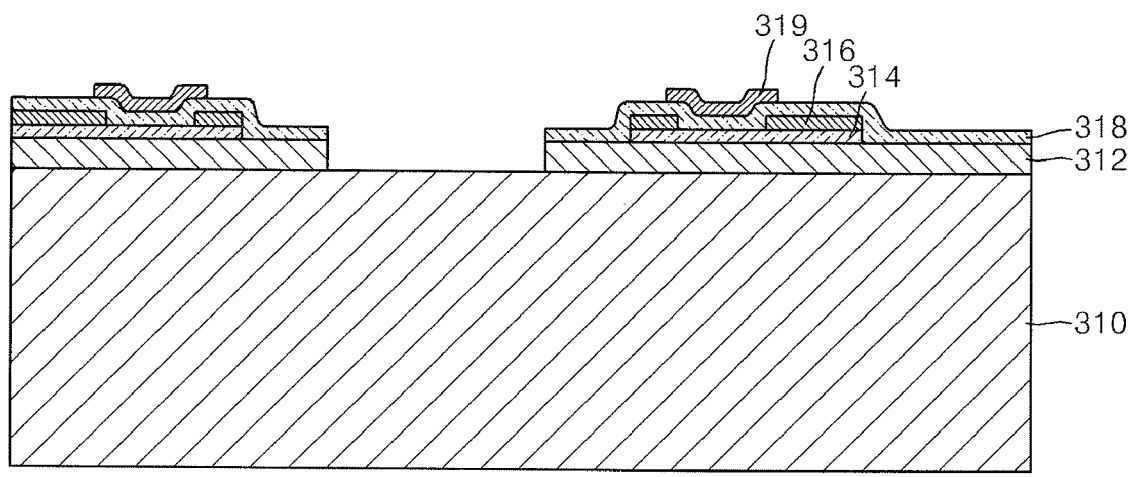
FIGS. 14 through 21 are views illustrating a method of manufacturing an inkjet printhead, according to another embodiment of the present invention.

Referring to FIG. 14, insulating layers 312, heaters 314, electrodes 316, passivation layers 318 and anti-cavitation layers 319 are sequentially formed on a substrate 310. Since these elements have been described above, their descriptions will be omitted. Then, the passivation layers 318 and the insulating layers 312 are sequentially etched to expose a top surface of the substrate 310.

Figure 15:
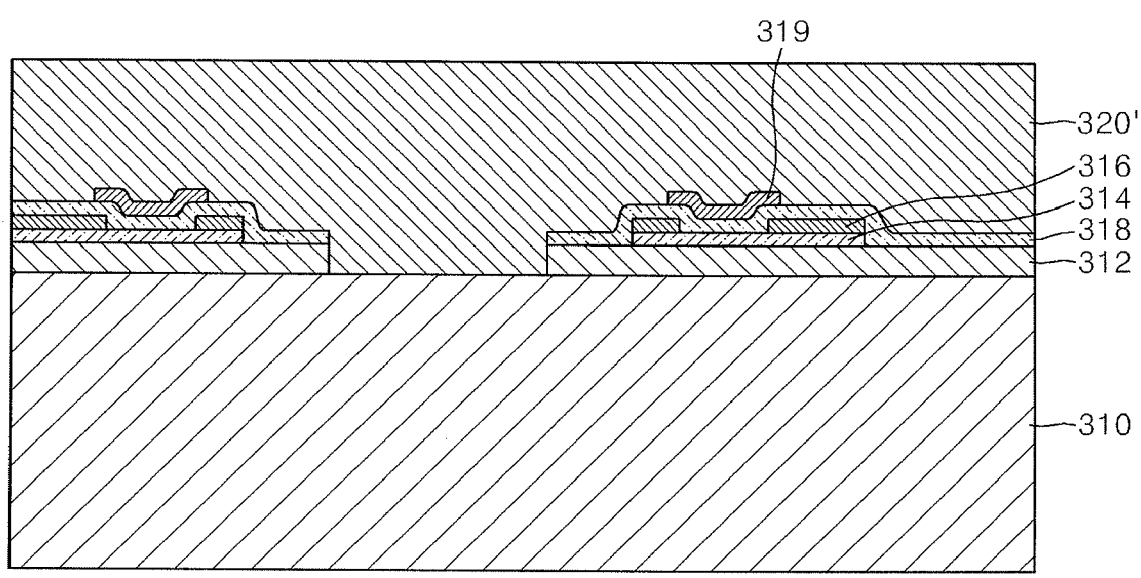
Figure 16:
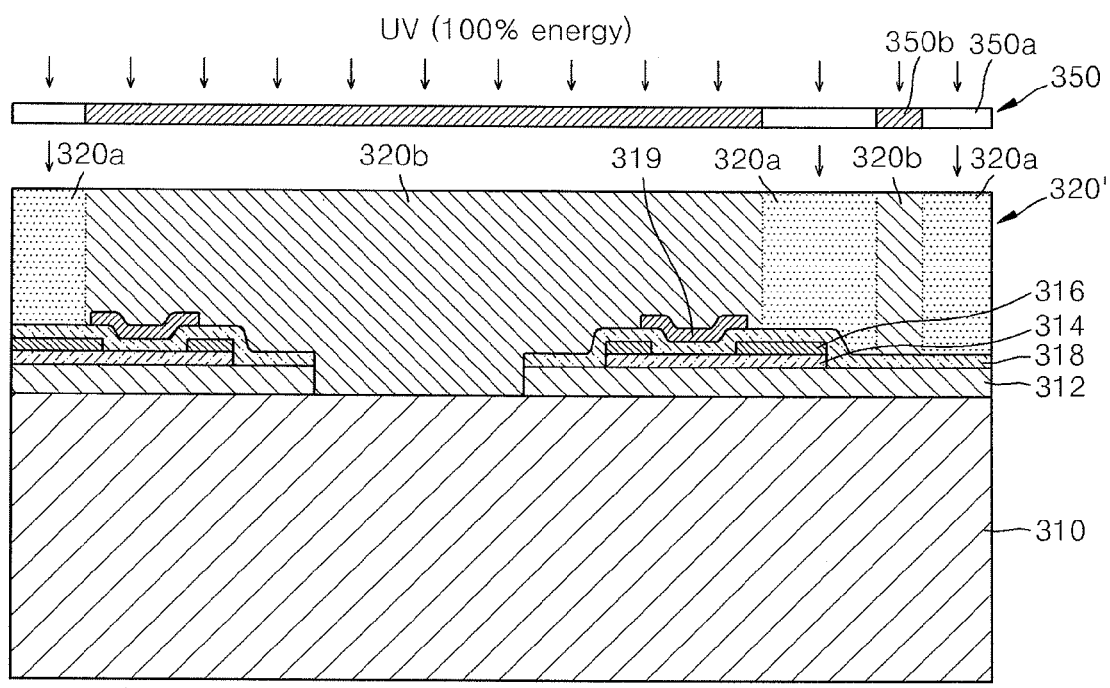
Figure 17:
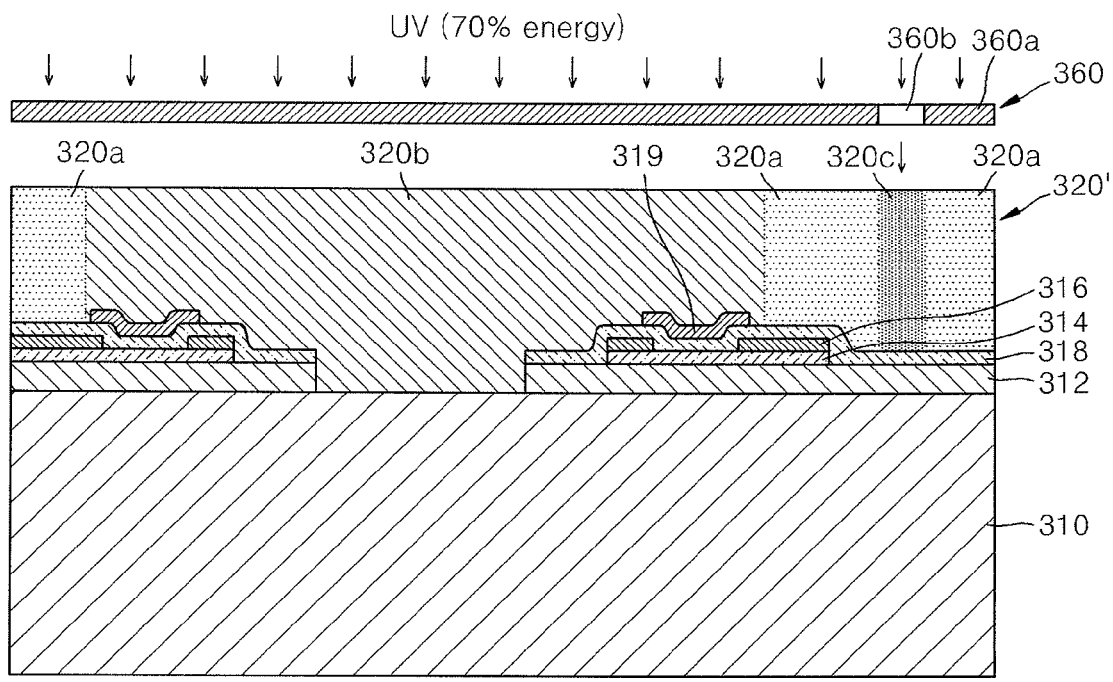

Referring to FIG. 15, a chamber material layer 320' formed of photosensitive epoxy is formed on the substrate 310, on which a plurality of material layers are formed to, a predetermined thickness. The photosensitive epoxy may be a negative photoresist. The chamber material layer 320' may be formed to a thickness of about 15 μm. However, the present invention is not limited thereto. Referring to FIG. 17, first exposure patterns 320a are formed by performing a first exposure operation on the chamber material layer 320'. In particular, a first photomask 350, in which light shielding patterns 350b and light transmitting patterns 350a are formed, is positioned above the chamber material layer 320', and then the chamber material layer 320' is exposed to ultraviolet (UV) rays for a predetermined time. The light shielding patterns 350b may be formed of, for example, Cr, and the light transmitting patterns 350a may be formed of, for example, transparent glass. In the first exposure operation, the first exposure patterns 320a are formed by exposing the chamber material layer 320' positioned below the light transmitting patterns 350a to UV rays. UV energy used for forming the first exposure patterns 320a is first UV energy at 100% exposure. The fact that the first exposure patterns 320a are exposed at 100% exposure means that the first exposure patterns 320a are never developed even though a non-exposed portion 320b is entirely removed through a developing operation as will be later described.

Referring to FIG. 17, a second exposure operation is performed on the chamber material layer 320', to which the first exposure operation has been performed, to form second exposure patterns 320c. In particular, a second photomask 360, in which light shielding patterns 360b and light transmitting patterns 360a are formed, is positioned above the chamber material layer 320', and then the chamber material layer 320' is exposed to ultraviolet (UV) rays for a predetermined time. In the second exposure operation, the non-exposed portion 320b of the chamber material layer 320', which is positioned below the light transmitting patterns 360a of the first photomask 360, is exposed to UV rays to form the second exposure patterns 320c. The second exposure patterns 320c may be formed to a predetermined shape on the edge portion of the chamber material layer 320'. However, the present invention is not limited thereto. UV energy used for forming the second exposure patterns 320c is second UV energy, the amount of which is less than that of the first UV energy. For example, the second UV energy may be 70% of the first UV energy. The second exposure patterns 320c may be formed by exposing the non-exposed portion 320b to 70% of the first UV energy. The first UV energy and the second UV energy can be controlled according to an exposure time. For example, when the first UV energy is obtained by exposing the chamber material layer 320' to UV rays for ten seconds, the second UV energy can be obtained by exposing the chamber material layer 320' to UV rays for seven seconds.

Figure 18:
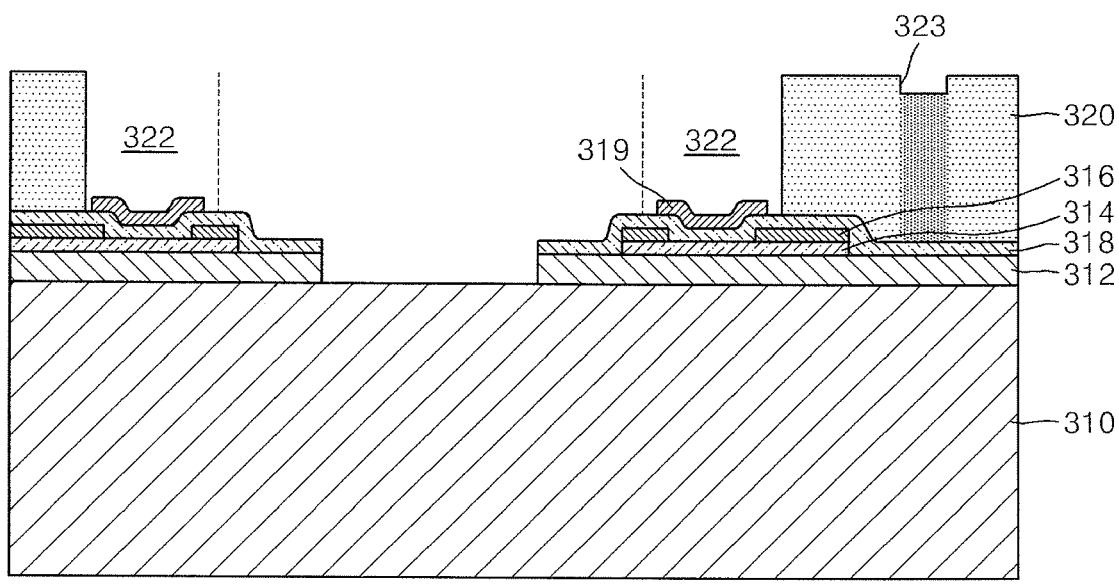

Referring to FIG. 18, a developing operation is performed on the chamber material layer 320', to which the first and second exposure operations have been performed, to form a chamber layer 320. In the developing operation, the non-exposed portion 320b of the chamber material layer 320' is entirely removed by a developer to form ink chambers 322. Accordingly, the ink chambers 322 are formed corresponding to the shape of the non-exposed portion 320b. The first exposure patterns 320a are not developed so as to remain in the chamber layer 320. Since the second exposure patterns 320c are exposed to 70% of the first UV energy, only a part of the second exposure patterns 320c reacts with a developer to remove the part of the second exposure patterns 320c. Accordingly, grooves 323, each of which has the shape corresponding to each of the second exposure patterns 320c, may be formed in the chamber layers 320. The grooves 323 may be formed to a predetermined shape having a thickness in the range 1 to 5 μm. In the present embodiment, one of the grooves 323 is illustrated as formed in the chamber layer 320, however, the present invention is not limited thereto, and thus, it will be understood by one of ordinary skill in the art that two or more grooves 323 may be formed in the chamber layer 320. In this case, the grooves 323 may be formed close to the edge portion of the chamber layer 320. Likewise, each of the grooves 323 formed in the chamber layer 320 functions as an indicator that can make the chamber layer 320 have a desired thickness during CMP.

Meanwhile, the applicant measured the depths of the grooves 323 formed on the chamber layers 320 based on an exposure time. When an exposure time required for exposing the chamber material layer 320' to UV rays at 100% exposure is based on 15 seconds, the depth of grooves 323 formed on the chamber layers 320 are 1.0 μm, 2.0 μm and 4.8 μm for exposure times of ten seconds, eight seconds and five seconds, respectively. Thus, it can be seen from the experiment that the grooves 323 can be formed in the chamber layers 320 to various depths by changing the UV energy based on the exposure time.

Figure 19:
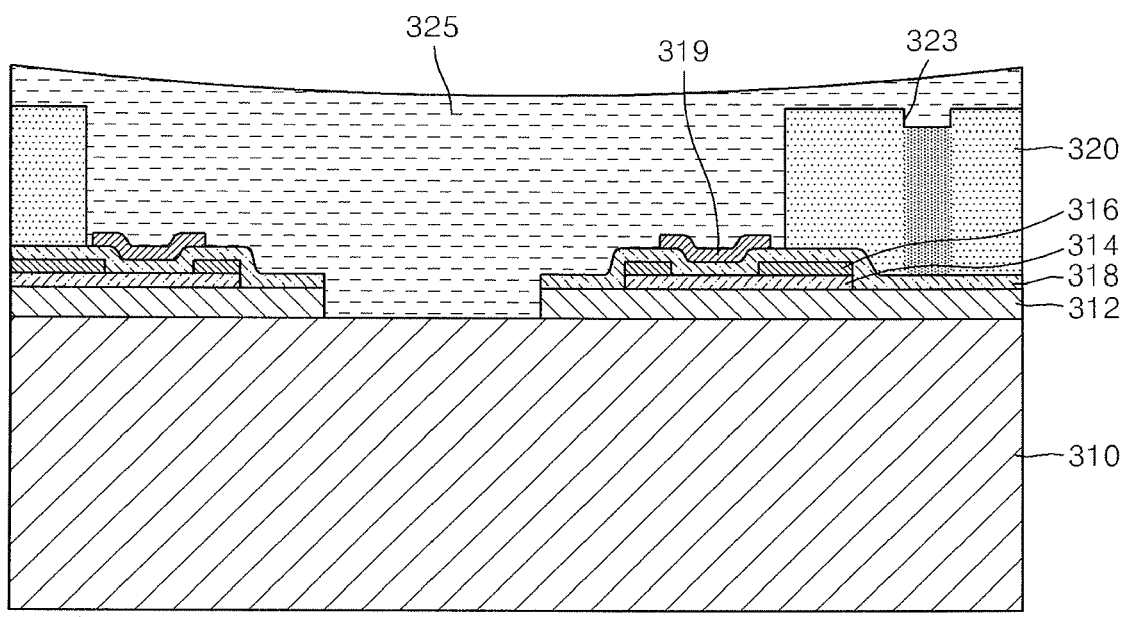
Figure 20:
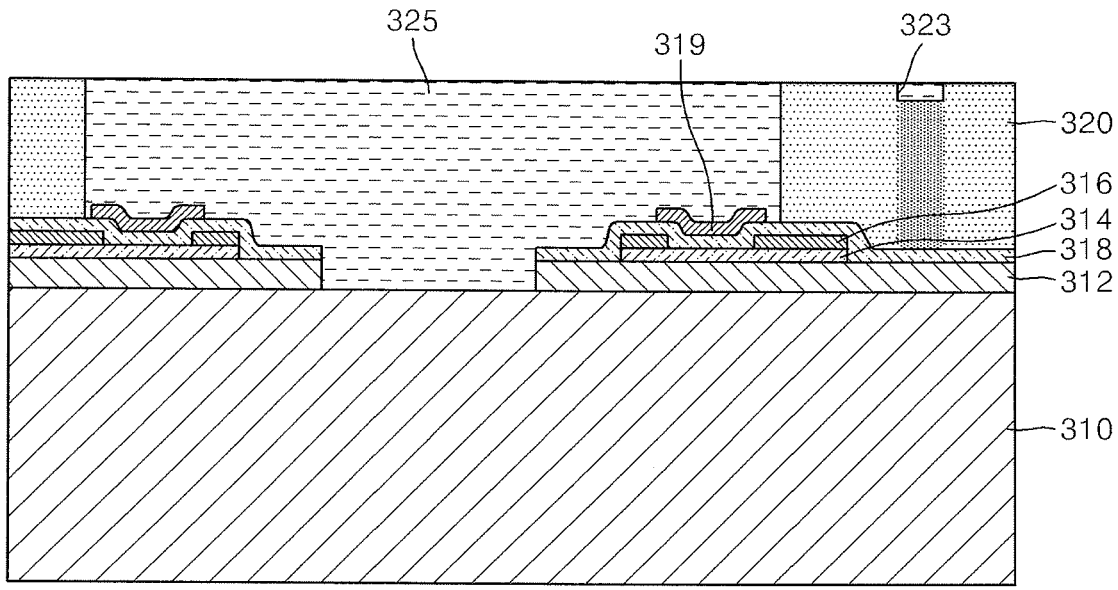
Figure 21:
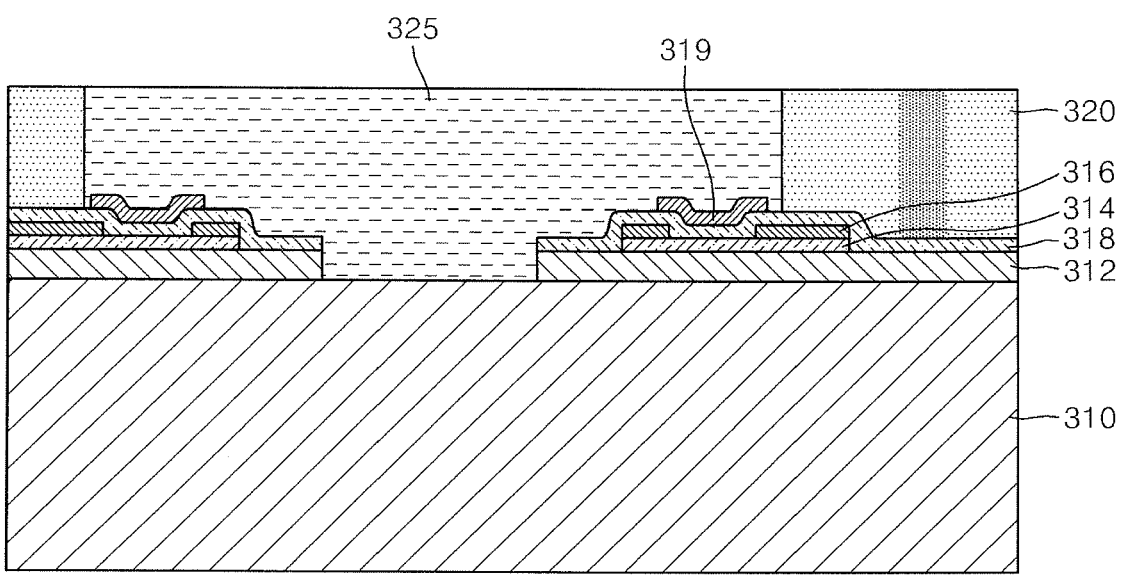

Referring to FIG. 19, a sacrificial layer 325 is formed on the chamber layer 320 to fill into the ink chamber 322 and the groove 323. The sacrificial layer 325 is formed to a thickness greater than the chamber layer 320. Then, CMP is gradually performed on the sacrificial layer 325 until the top surface of the chamber layer 320 is flush with the top surface of the sacrificial layer in the groove 323. Thus, the chamber layer 320 and the sacrificial layer 325 filled in the groove 323 are exposed, as illustrated in FIG. 20. The CMP is continually performed until the sacrificial layer 325 filled in the groove 323 is completely removed. Likewise, the grooves 323 formed in the chamber layer 320 and the sacrificial layer 325 filled in the grooves 323 each function as an indicator that notifies an end point of the CMP. Accordingly, the top surfaces of the chamber layer 320 and the sacrificial layer 325 can be planarized, and the chamber layer 320 can be accurately processed to have a desired thickness, as illustrated in FIG. 21. Thus, the performance of the inkjet printhead can be improved. In addition, a nozzle layer (not shown) including nozzles formed therein is formed on the top surfaces of the sacrificial layer 325 and the chamber layers 320, which have been planarized, in a following operation.

As described above, according to the present invention, a photosensitive epoxy structure including a step difference formed therein can be manufactured using photolithography processes in which UV energies having different amounts from each other are respectively used. In addition, circular grooves are formed in a nozzle layer of an inkjet printhead to each surround each nozzle formed in the nozzle layer by using the photolithography processes, and thus the ejection characteristic of ejected ink droplets can be improved. In addition, the grooves are formed in the chamber layer of the inkjet printhead through CMP by using the photolithography processes to function as indicators during CMP to thereby accurately form the chamber layer to a desired thickness, and thus the performance of the inkjet printhead can be improved.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing an inkjet printhead, the method comprising:
   forming a chamber layer, which includes an ink chamber formed in the chamber layer, on a substrate on which heaters and electrodes are formed;
   forming a sacrificial layer on the chamber layer to fill into the ink chamber;
   forming a nozzle material layer, formed of photosensitive epoxy, on the sacrificial layer and the chamber layer;
   forming a first exposure pattern in the nozzle material layer by performing a first exposure operation;
   forming a second exposure pattern in a non-exposed portion of the nozzle material layer by performing a second exposure operation in which UV energy having an amount less than the amount of UV energy used in the first exposure operation; and
   forming a nozzle layer, in which a nozzle and at least one groove surrounding the nozzle is formed, by developing the nozzle material layer.

2. The method of claim 1, wherein the photosensitive epoxy is a negative photoresist.

3. The method of claim 2, wherein the nozzle is formed corresponding to a shape of the non-exposed portion of the nozzle material layer, and the at least one groove is formed corresponding to a shape of the second exposure pattern.

4. The method of claim 3, wherein in the developing of the nozzle material layer, the non-exposed portion of the nozzle material layer is entirely removed to form the nozzle.

5. The method of claim 3, wherein in the developing of the nozzle material layer, the first exposure pattern is not developed, and only a part of the second exposure pattern is developed to form the at least one groove in the nozzle layer.

6. The method of claim 3, wherein the at least one groove circularly surrounds the nozzle.

7. The method of claim 1, wherein UV energies used in the first exposure operation and the second exposure operation are controlled according to an exposure time.

8. A method of manufacturing an inkjet printhead, the method comprising:
   forming a chamber material layer formed of photosensitive epoxy on a substrate on which a heater and an electrode are formed;
   forming a first exposure pattern in the chamber material layer by performing a first exposure operation;
   forming a second exposure pattern surrounding a non-exposed portion of the chamber material layer by performing a second exposure operation in which UV energy having an amount less than the amount of UV energy used in the first exposure operation; and
   forming a chamber layer, in which an ink chamber and at least one groove are formed, by developing the chamber material layer.

9. The method of claim 8, further comprising:
   forming a sacrificial layer on the chamber layer to fill into the ink chamber and the at least one groove; and
   planarizing top surfaces of the sacrificial layer and the chamber layer by using chemical mechanical polishing (CMP),
   after forming of the chamber layer.

10. The method of claim 9, wherein the chemical mechanical polishing (CMP) is terminated at a point when the sacrificial layer filled in the at least one groove is removed.

11. The method of claim 8, wherein the photosensitive epoxy is a negative photoresist.

12. The method of claim 11, wherein the ink chamber is formed corresponding to a shape of the non-exposed portion of the chamber material layer, and the at least one groove is formed corresponding to a shape of the second exposure pattern.

13. The method of claim 12, wherein in the developing of the chamber material layer, the non-exposed portion of the chamber material layer is entirely removed to form the ink chamber.

14. The method of claim 12, wherein in the developing of the chamber material layer, the first exposure pattern is not developed, and only a part of the second exposure pattern is developed to form the at least one groove in the chamber layer.

15. The method of claim 14, wherein the at least one groove is formed to a depth in the range 1 to 5 μm.

16. The method of claim 8, wherein UV energies used in the first exposure operation and the second exposure operation are controlled according to an exposure time.

* * * * *